United States Patent [19]
Berger

[11] Patent Number: 4,515,304
[45] Date of Patent: May 7, 1985

[54] MOUNTING OF ELECTRONIC COMPONENTS ON PRINTED CIRCUIT BOARDS

[75] Inventor: Jean P. Berger, Stittsville, Canada

[73] Assignee: Northern Telecom Limited, Montreal, Canada

[21] Appl. No.: 424,031

[22] Filed: Sep. 27, 1982

[51] Int. Cl.³ .............................................. H05K 3/34
[52] U.S. Cl. ................................... 228/136; 228/187; 228/248; 228/180.1; 228/180.2
[58] Field of Search ............... 228/123, 180 R, 180 A, 228/187, 136, 248

[56] References Cited

U.S. PATENT DOCUMENTS

| | | | |
|---|---|---|---|
| 3,583,063 | 6/1971 | Growney | 228/180 R |
| 3,904,102 | 9/1975 | Chu et al. | 228/180 R |
| 4,139,881 | 2/1979 | Shimizu et al. | 228/180 R |
| 4,334,646 | 6/1982 | Campbell | 228/180 A |
| 4,396,140 | 8/1983 | Jaffe et al. | 228/180 A |

*Primary Examiner*—Kenneth J. Ramsey
*Attorney, Agent, or Firm*—Sidney T. Jelly

[57] ABSTRACT

Mounting of leaded components on one side of a PCB and surface mounting components on the other side of the PCB creates problems. The pressure of the lead ends projecting through the PCB prevents the use of a mask for applying solder paste for the mounting of the surface mounting components. Attaching surface mounting components initially by adhesive prior to wave soldering also causes problems. In the present invention leaded components are inserted and the lead ends crimped. The board is then turned over, solder paste applied by individual applicator nozzles to the lead ends and to solder pads on the circuit pattern. The surface mounting components are then positioned with contact areas aligned with the solder pads and the whole reflow soldered. The process can be repeated for surface mounting components on the same side as the original leaded components, with or without the insertion of further leaded components on the same side as the original surface mounting components.

11 Claims, 10 Drawing Figures

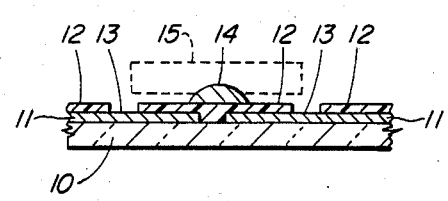
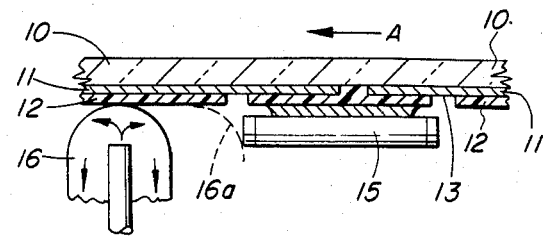
FIG. 1a          FIG. 1b
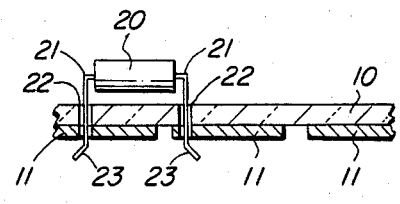
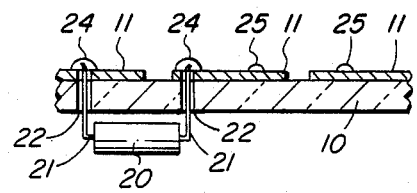
FIG. 2          FIG. 3
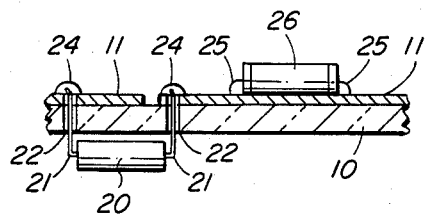
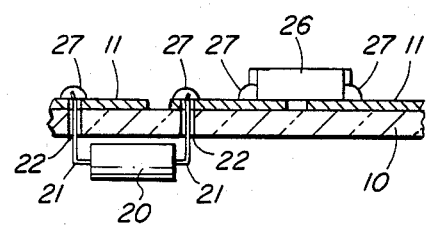
FIG. 4          FIG. 5
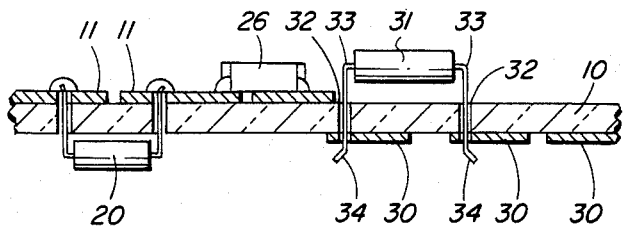
FIG. 6

MOUNTING OF ELECTRONIC COMPONENTS ON PRINTED CIRCUIT BOARDS

This invention relates to the mounting of electronic components on printed circuit boards, and is particularly concerned with the mounting leaded components on one side and surface mounted components on the other side of printed circuit boards.

A printed circuit board (PCB) comprises a flat sheet-like support member, for example of glass fiber reinforced resin, with electrical circuit patterns on one or both surfaces. The components mounted on the PCB may be leaded components or surface mounted components. Leaded components have leads extending down from the component, the leads being inserted into holes through the PCB. The ends of the leads extend through to the surface of the PCB remote from the component and are soldered to the circuit pattern on that surface. Surface mounted components have contact areas on the components which are connected by solder to solder pads forming part of the circuit pattern on the PCB. Surface mounting components are often first attached to the PCB by adhesive, prior to soldering.

Surface mounted components can be mounted readily on their own. Solder paste can be applied through a mask, on to contact pads, the components positioned, and then the solder melted, by reflow soldering. Alternatively, surface mounted components are positioned on the PCB with a bead of adhesive between component and board. After curing of the adhesive, the components are soldered to the circuit pattern by wave soldering.

Leaded components are readily wave soldered after insertion. The leaded components are on the upper surface of the PCB and the ends of the leads project through holes in the PCB and in the circuit pattern on the lower surface of the PCB. Thus wave soldering is easy and convenient and is effective.

With surface mounted components mounted initially by an adhesive and then with the PCB turned over, wave soldering can be carried out, as stated above, but certain problems arise in that the wave of solder has a curved surface and as the board travels over the wave, the wave meets vertical edges of the components. Air can be trapped and poor quality solder joints result.

Problems are compounded when leaded components and surface mounted components are required to be mounted on the same PCB, and this becomes even worse if it is desired to mount surface mounted components on the reverse side of the PCB to the leaded components. With leaded components on one side and surface mounted components on the other side, if wave soldering is used then the poor quality solder joints of surface mounted components result. If the PCB is turned so that the surface mounted components are on top, to permit reflow soldering, the leaded components are likely to fall out. Even if they do not fall out, the ends of the leads extending up through the PCB prevent the use of a mask for the application of solder paste, as the mask must set down in contact with the PCB.

The invention provides a very efficient and effective process for the mounting of leaded components and surface mounting components on PCB's, with the different forms of components on either side of the PCB. The use of wave soldering is avoided, and high quality solder joints are obtained.

Broadly, the present invention comprises inserting leaded components on one side of a PCB, cutting and clinching the ends of the leads on the other side of the PCB, turning the PCB over, applying solder paste at the lead ends and on solder pads at predetermined positions on the circuit pattern on the other side of the PCB by individual ejection of solder paste from individual applicator nozzles, positioning surface mounting components on said other side, and reflow soldering to solder both the leads and the surface mounting components.

By the use of solder pastes having different melting temperatures, surface mounting components can then be soldered on to the one side on which are mounted the leaded components. It is further possible to repeat the above process, for leaded components inserted from the other side and surface mounting components mounted on the one side, starting with the PCB in the reverse or upside down position.

The invention will be readily understood by the following description, in conjunction with the accompanying diagrammatic drawings, in which:

FIG. 1 illustrates the wave soldering of surface mounted components;

FIGS. 2 to 5 illustrate the various steps of the present invention with leaded components on one side of a PCB and surface mounted components on the other side;

FIGS. 6 to 9 illustrate the various further steps for mounting leaded components and surface mounting components in a reverse arrangement to that in FIG. 5.

Figure 7:
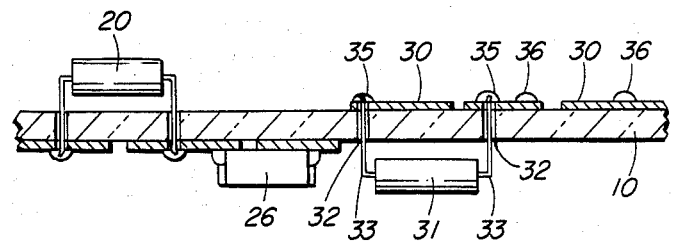

FIG. 1 illustrates the application of wave soldering to surface mounted components. A PCB support member is indicated at 10, electrical circuit patterns at 11 and a masking layer 12 which defines solder pads 13 on the circuit patterns. In FIG. 1(a) a bead of adhesive is indicated at 14. A component, indicated in dotted outline at 15, is then positioned on the adhesive, which is cured to attach the component to the PCB. The PCB is then inverted for wave soldering. This is illustrated in FIG. 1(b). The solder wave is indicated at 16 and the PCB, with attached components, is moved over the solder wave, as indicated by arrow A. The solder wave eventually meets a front end or edge of a component, as indicated at 16a. Ideally a smooth fillet of solder should extend from the metal plated end of the component into the solder pad and in good contact with the related circuit pattern. However, as can be seen from FIG. 1(a), there is a considerable possibility of trapping air at the solder joint. The same sort of problem can arise at the rear end or edge as the solder wave passes over the rear of the component. Also it is possible that some of the adhesive may sputter or run on to pads 13. Apart from providing for a good electrical contact between circuit and component, the solder joint must be strong enough to withstand stresses arising from thermal mismatch between component and PCB. Often hand touch-up is necessary to provide satisfactory joints. A further, and often more important problem is that soldering flux trapped between the component and the PCB is in the least very difficult to remove and can give rise to corrosion problems at a later date. As previously stated, reflow soldering, using solder pastes applied by screening or stencil printing is now being used to replace wave soldering of surface mounted components but the screen or stencil must be in contact with the PCB.

However, with the present technology evolution, most PCB's are populated with large power resistors, transformers and other leaded components in addition to leadless chip components, i.e. surface mounted components. The leadless components are often to be mounted on the opposite side of the PCB to the leaded components. The screen or stencil through which solder paste would be applied cannot be brought into contact with the PCB because of the ends of the leads of the leaded components. Therefore, the superior, preferable, reflow solder technique cannot be used for such arrangements.

FIGS. 2 to 5 illustrate the steps in a process whereby the reflow solder technique can be applied. In the Figures, the PCB support member is again indicated at 10 and circuit patterns at 11. Leaded components, one of which is indicated at 20 are attached by inserting the leads 21 through holes 22 in the PCB and circuit patterns and the leads cut and clinched or crimped, as indicated at 23. The clinching or crimping prevents the components from falling out when the PCB is inverted. FIG. 3 shows the PCB inverted and with dots of solder paste applied, at 24 on the ends of the leads 21, and at 25 for use with a surface mounted or leadless components. The dots of solder paste are applied by an automated applicator which positions the dots of solder paste accurately and in precision-metered amounts.

FIG. 4 illustrates the step in which a leadless or surface mounting component 26 is positioned on the PCB, the metal plated ends of the component in contact with the solder paste dots 25. The PCB and components are then "reflow soldered". By this is meant that the PCB, components and solder paste are heated to a temperature whereby the solder paste fuses and connects components to circuit patterns. This condition is seen in FIG. 5, the new soldered joints indicated at 27. The heating can be by various means, a typical one being "Vapour Phase Reflow Soldering", in which the PCB's and components are passed through a vapour which is at a predetermined temperature. The characteristics of vapour, and solder paste will be described later.

FIGS. 6 to 9 illustrate the additional steps which occur when leaded components are also to be mounted on the side of the PCB opposite to the leaded components as illustrated in FIGS. 2 to 5. In FIGS. 6 to 9 a further series of circuit patterns 30 are formed on the side opposite to patterns 11. Components mounted in the first series of steps, as in FIGS. 2 to 5, are indicated by the same reference numerals as in FIGS. 2 to 5.

Figure 8:
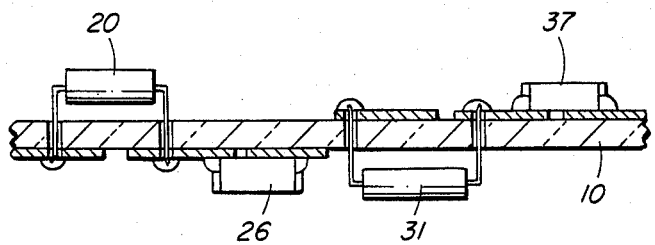
Figure 9:
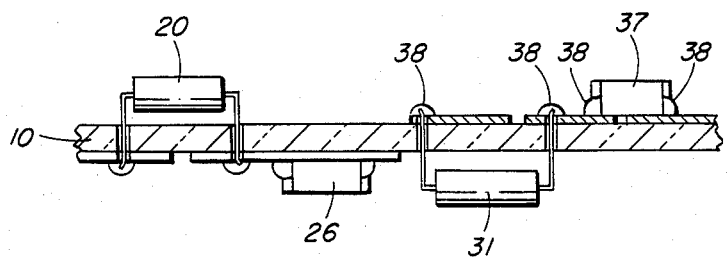

In FIG. 6 a leaded component 31 has been inserted, through holes 32, and the leads 33 cut and crimped, as indicated at 34. The PCB is then inverted and dots of solder paste applied, at 35 over the ends of the leads 33, and at positions 36 coincident with the ends of leadless or surface mounting components. In FIG. 8 a leadless component 37 has been positioned on the PCB and in FIG. 9 the PCB has been reflow soldered, the solder joints indicated at 38.

It is possible that only the second series of leaded components 31 be required, on the opposite side of the PCB to the first series 20. In that case, the steps would be a FIG. 6, then FIG. 7 but with the solder dots 35 only. FIG. 8 step is omitted and the assembly reflow soldered, as FIG. 9 but with the components 37 not present. Similarly, only leadless or surface mounting components 37 are required on the other side to components 26. In this case the step of FIG. 6 is omitted, the dots of solder paste 36 only applied in the step of FIG. 7, the component positioned as in FIG. 8, and the assembly reflow soldered.

It will be apparent that, with two reflow soldering steps or stages, solders with differing melting temperatures will be required. More freedom of selection occurs when only one reflow step is required.

For two reflow soldering steps, the first reflow soldering is carried out with a solder composed of 63% lead and 34% tin, which is an eutectic alloy and has a melting temperature of 183° C. For the second reflow soldering step, the solder used is composed of 43% lead 43% tin and 14% bismuth, and again is an eutectic alloy. The melting point of this solder is between 173° and 174° C.

As stated, the reflow soldering step can be carried out by various forms of heating. A convenient one, which can be used for both of the solders described above, is vapour phase reflow soldering. In this process, a specific liquid is heated to a vapourization temperature, heat also being applied to the vapour. Depending upon the liquid, and the resultant vapour, so certain specific temperatures are obtained.

As an example, for the 63/37 solder, a liquid supplied by The 3M Company with the designation FC70 has a vapour the maximum temperature of which is 215° C. This temperature is used in the reflow soldering of the 63/37 solder. The temperature is the maximum which the vapour can attain. For the 43/43/14 solder a liquid supplied by The 3M Company with the designation FC43 is used. The maximum temperature the vapour of this liquid can attain is 174° C. As the solders are eutectic alloys, the melting points are well and tightly defined. Thus the vapour temperature of 174° C. will readily reflow the 43/43/14 solder used for the second series of components, but will not affect the 63/37 solder joints for the first series of components.

Another form of heating is infra-red heating. This form of heating can be closely controlled and different temperatures can be obtained for the different melting point solders. Infra-red heating also enables temperatures to be attained which cannot be attained with a vapour. Some solders may require higher temperature than those obtainable with a vapour and infra-red heating is one way of meeting such requirements. Other forms of heating can also be used.

The invention avoids the use of wave soldering with its accompanying problems. The entire process can be automated, including insertion, cutting and crimping of leaded components, application of solder paste, positioning of leadless or surface mounting components and reflow soldering. High yields are obtained. The application of the solder paste can be accurately controlled in quantity and precisely positioned, as by optical scanning. Depending upon the number of boards to be processed and the number and positioning of solder joints multiple head applicators can be used.

The leaded components may comprise electronic components, such as large scale integrated circuits on chips and other electronic devices, and also electrical components such as connectors, transformers and other devices. The leadless components, or surface mounting components, may comprise resistors, capacitors and also integrated circuits with leadless encapsulation.

What is claimed is:

1. A method of mounting electronic components on printed circuit boards, comprising;
   inserting leaded components on a first side of a circuit board, the leads passing through holes in the circuit board, said first side being uppermost;
   clinching the leads on a second side of the circuit board;
   turning the circuit board over;

applying solder paste at the ends of the leads and on solder pads at predetermined positions on a circuit pattern on said second side through individual applicator nozzles;

positioning surface mounting components on said second side, contact positions on said components aligned with said solder pads;

reflow soldering to solder both said leads and said surface mounting components to said circuit pattern;

inserting further leaded components in said circuit board, said further components inserted on said second side of said circuit board, the leads passing through holes in the circuit board, said second side being uppermost;

clinching the leads of the further leaded components on the first side of the circuit board;

turning the circuit board over;

applying solder paste to the ends of the leads of the further leaded components through individual applicator nozzles; and reflow soldering to solder the leads of the further leaded components to a circuit pattern on said first side, the soldering to the circuit pattern on said first side being carried out at a lower temperature than the soldering of leads and components to the circuit pattern on said second side.

2. A method as claimed in claim 1, said reflow soldering being carried out by vapour phase resoldering.

3. A method as claimed in claim 1, said reflow soldering being carried out by infra-red heating.

4. A method as claimed in claim 1, said reflow soldering of the leads of the further leaded components being carried out by vapour phase resoldering.

5. A method as claimed in claim 1, said reflow soldering of the leads of the further leaded coponents being carried out by infra-red heating.

6. A method as claimed in claim 1, including applying said solder paste to the ends of the leads of the further leaded components and on solder pads at predetermined positions on the circuit pattern on the first side;

positioning further surface mounting components on the first side, contact positions on the surface mounting components aligned with said solder pads; and reflow soldering to solder both the leads of the further leaded components and the further surface mounting components to the circuit pattern on the first side.

7. A method as claimed in claim 6, said reflow soldering of the leads of the further leaded components the further surface mounting components being carried out by vapour phase resoldering.

8. A method as claimed in claim 6, said reflow soldering of the leads of the further leaded components and the further surface mounting components being carved out by infra-red heating.

9. A method of mounting electronic components on printed circuit boards, comprising;

inserting leaded components on a first side of a circuit board, the leads passing through holes in the circuit board, said first side being uppermost;

clinching the leads on a second side of the circuit board;

turning the circuit board over;

applying solder paste at the ends of the leads and on solder pads at predetermined positions on a circuit pattern on said second side through individual applicator nozzles;

positioning surface mounting components on said second side, contact positions on said components aligned with said solder pads;

reflow soldering to solder both said leads and said surface mounting components to said circuit pattern;

applying solder paste on solder pads at predetermined positions on a circuit pattern on the first side of the circuit board through individual applicator nozzles;

positioning further surface mounting components on said first side, contact positions on said further surface mounting components being aligned with the solder pads on the circuit pattern on said first side; and reflow soldering to solder the further surface mounting components to the circuit pattern on said first side, the soldering to the circuit pattern on the first side being carried out at a lower temperature than the soldering to the circuit pattern on the second side.

10. A method as claimed in claim 9, the reflow soldering of the further surface mounting components being carried out by vapour phase resoldering.

11. A method as claimed in claim 9, the reflow soldering of the further surface mounting components being carried out by infra-red heating.

* * * * *

UNITED STATES PATENT AND TRADEMARK OFFICE
CERTIFICATE OF CORRECTION

PATENT NO. : 4,515,304

DATED : May 7, 1985

INVENTOR(S) : Jean P. Berger, et al

It is certified that error appears in the above-identified patent and that said Letters Patent is hereby corrected as shown below:

On the title page, Item (75) after "Stittsville;" add
-- Carlyle W. Crothers, Kinburn, both of Canada --

Signed and Sealed this

Seventeenth Day of September 1985

[SEAL]

Attest:

Attesting Officer

DONALD J. QUIGG

Commissioner of Patents and Trademarks—Designate